(12) United States Patent
Arai

(10) Patent No.: US 6,388,589 B1
(45) Date of Patent: May 14, 2002

(54) PROGRAMMABLE VIDEO INTERFACE

(75) Inventor: George T. Arai, Escondido, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/617,690

(22) Filed: Jul. 17, 2000

(51) Int. Cl.[7] .............................................. H03M 7/00
(52) U.S. Cl. ......................... 341/78; 341/50; 341/155; 341/67; 341/106
(58) Field of Search ....................... 341/78, 141, 155, 341/106, 67, 95, 102, 50

(56) References Cited

U.S. PATENT DOCUMENTS

| | | | | |
|---|---|---|---|---|
| 4,866,445 A | * | 9/1989 | Valero et al. ................ | 341/106 |
| 5,134,396 A | * | 7/1992 | Strat et al. ..................... | 341/51 |
| 5,489,901 A | * | 2/1996 | Fukuds et al. ................. | 341/78 |
| 5,703,658 A | * | 12/1997 | Tsure et al. ................... | 348/554 |
| 5,874,909 A | * | 2/1999 | Soenen et al. ............... | 341/141 |
| 6,232,893 B1 | * | 5/2001 | Cliff et al. .................... | 341/78 |

* cited by examiner

Primary Examiner—Michael Tokar
Assistant Examiner—Lam T. Mai
(74) Attorney, Agent, or Firm—Harness, Dickey & Pierce, P.L.C.

(57) ABSTRACT

A programmable video interface (20) eliminates the need for select-in-test parts during manufacture. The video interface (20) includes a scaling module (40) and a programming module (60). The scaling module (40) converts an analog input signal into a digital output signal based on a plurality of analog programming signals. The programming module (60) generates the plurality of analog programming signals, where the analog programming signals maintain operation of the scaling module at a predetermined transfer characteristic and an associated tolerance. The programming module generates the plurality of analog programming signals based on digital programming data. The use of D/A converters (62, 64) in the programming module (60) allows the elimination of resistor divider networks and associated tolerance problems.

18 Claims, 6 Drawing Sheets

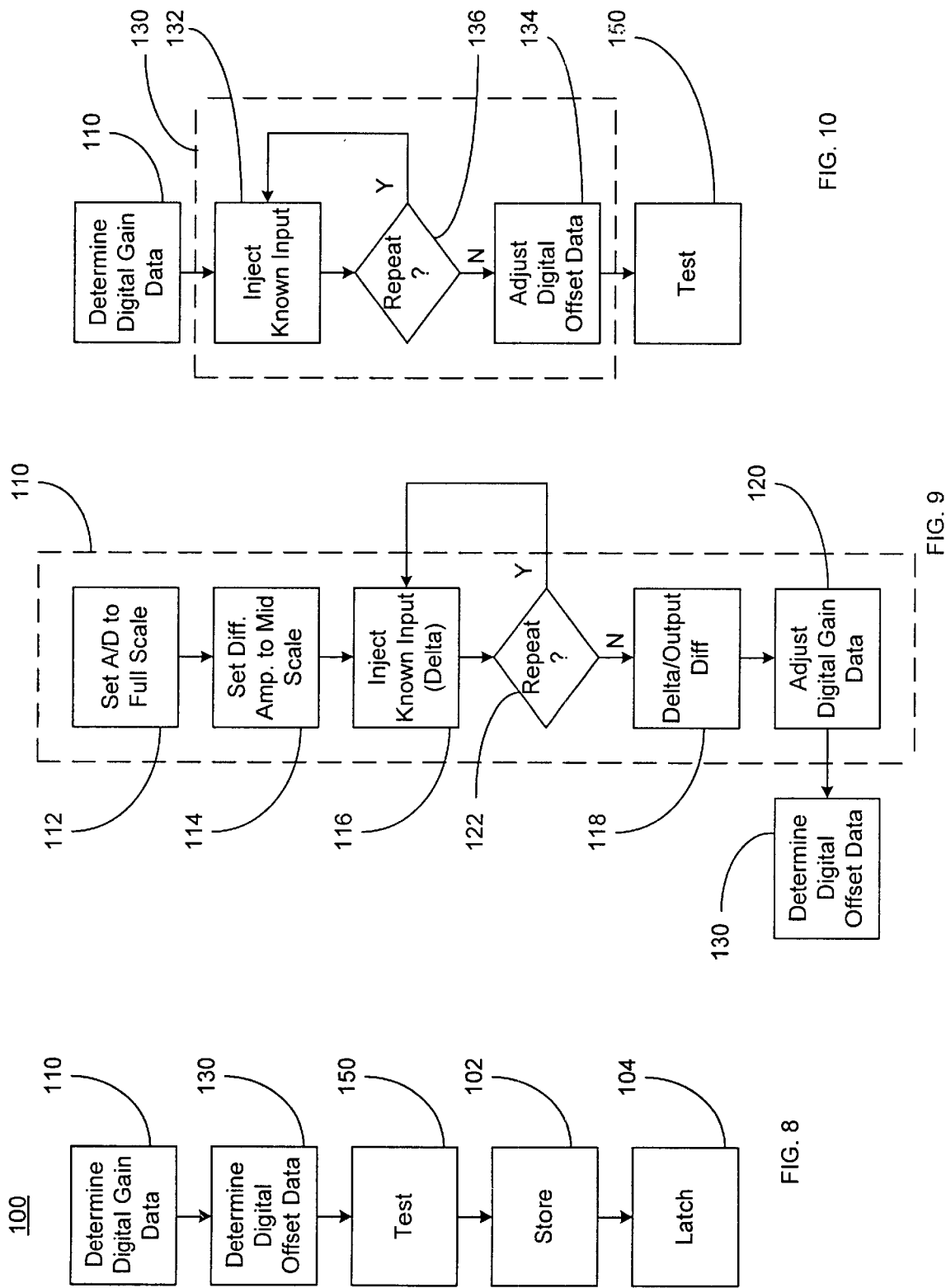

PROGRAMMABLE VIDEO INTERFACE

This invention was made with Government support under DAAJ09-91-C-A004, awarded by the U.S. Army. The U.S. Government has certain rights in this invention.

BACKGROUND OF THE INVENTION

1. Field of the Invention

This invention relates generally to video interfaces and, more particularly, to a programmable video interface that operates based on digital programming data.

2. Discussion of the Related Art

In many military and commercial aviation environments, it is necessary to accurately convert analog video signals into digital video signals for a variety of purposes. One such application is the identification system used by air traffic control or military aircraft. In these systems, a processor will analyze parameters such as the pulse width, pulse amplitude and position of the received digitized signal to determine the identity of the transmitting party. In order to generate the necessary digital signal for use by the processor, an analog input signal must be scaled and digitized based on a predetermined transfer characteristic. It is desirable that this transfer characteristic map the output of the log amp to the full scale input range of the A/D converter to ensure that the maximum available resolution is attained. It is not uncommon for the tolerance of this mapping to be specified at less than ±4%.

This requirement for accurate conversion of the analog input signal requires precise setting of amplifier gains and offsets. Conventional systems scale the output of the log amplifier, with a differential amplifier, to drive an analog to digital (A/D) converter which provides the necessary conversion based on the gain and offset settings. The gain of the differential amplifier is set by the ratio of resistance in its input and feedback networks. Similarly, the offset of the differential amplifier is set by the ratio of resistance in a voltage divider.

The prohibition of the use of potentiometers in military avionics circuitry creates a substantial problem in the design, manufacture and testing of the scaling module. This is because the accuracy requirements associated with video interfaces can exceed the production tolerances of the individual components, requiring "select-in-test" parts during manufacture. In particular, typical production tolerances for the log amplifier are on the order of 10%, which in itself exceeds the total error budget for the project. The costs associated with having to inventory a range of precision components (to insure that the particular value is available for the select-in-test process), the test and retest times, and labor can also be a significant part of the cost of production. It is therefore desirable to provide a programmable video interface that can meet the predetermined transfer characteristics and associated tolerances which are common to video applications allowing the automation of adjustments in lieu of the manual select-in-test process.

SUMMARY OF THE INVENTION

In accordance with the teachings of the present invention, a programmable video interface is disclosed. In one embodiment, the video interface includes a scaling module and a programming module. The scaling module converts an analog input signal into a digital output signal based on a plurality of analog programming signals. The programming module generates the plurality of analog programming signals, where the analog programming signals maintain operation of the scaling module at a predetermined transfer characteristic and an associated tolerance. The programming module generates the plurality of analog programming signals based on digital programming data. Providing a programming module that operates based on digital programming data enables the elimination of conventional voltage divider networks and accompanying inaccuracies.

The programming module utilizes a first digital to analog (D/A) converter to generate an analog offset signal based on digital offset data. A second D/A converter generates an analog gain signal, which sets the full scale voltage range of the A/D converter based on digital gain data. The plurality of analog programming signals include the analog offset signal and the analog gain signal, where the analog offset signal and the analog gain signal maintain operation of a programmable video interface scaling module at a predetermined transfer characteristic and an associated tolerance.

Further in accordance with the present invention, a method for programming a video interface programming module is disclosed. The method includes the step of determining digital offset data for the programming module, where the digital offset data corresponds to a predetermined transfer characteristic for the video interface. The programming module transmits an analog offset signal to a scaling module based on the digital offset data. The method further provides for determining digital gain data for the programming module, where the digital gain data corresponds to the predetermined transfer characteristic. The programming module transmits an analog gain signal to the scaling module based on the digital gain data. The scaling module converts an analog input signal into a digital output signal based on the predetermined transfer characteristic. The digital offset data and the digital gain data are also stored to a programmable memory device.

Additional objects, features and advantages of the invention will become apparent from the following description and the appended claims when taken in connection with the accompanying drawings.

BRIEF DESCRIPTION OF THE DRAWINGS

FIG. 8 is a flowchart of a method for programming a video interface programming module according to the present invention;

FIG. 9 is a flowchart of a process for determining digital gain data according to the present invention;

FIG. 10 is a flowchart of a process for determining digital offset data according to the present invention.

DETAILED DESCRIPTION OF THE PREFERRED EMBODIMENTS

The following discussion of the preferred embodiments directed to a programmable video interface is merely exemplary in nature, and is in no way intended to limit the invention or its applications or uses.

Figure 1:
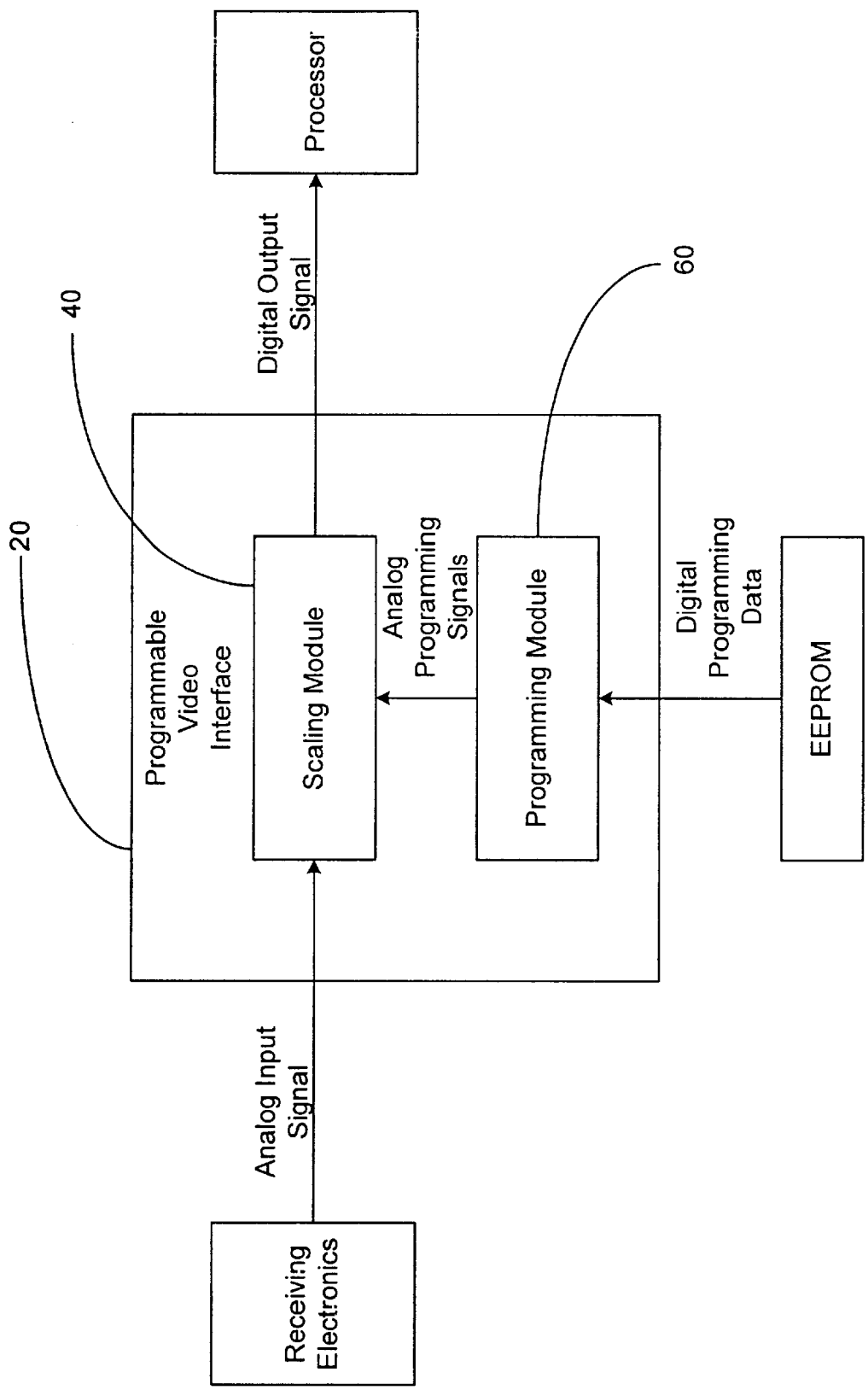
FIG. 1 is a block diagram of a programmable video interface according to the present invention.

Turning now to FIG. 1, a programmable video interface is shown generally at 20. The video interface 20 has a scaling module 40 and a programming module 60. The scaling module 40 converts an analog input signal into a digital output signal based on a plurality of programming signals to be described in greater detail below. The programming module 60 generates the plurality of analog programming signals, where the analog programming signals maintain operation of the scaling module 40 at a predetermined transfer characteristic and an associated tolerance. It is important to note that the programming module 60 generates the plurality of analog programming signals based on digital programming data.

Figure 4:
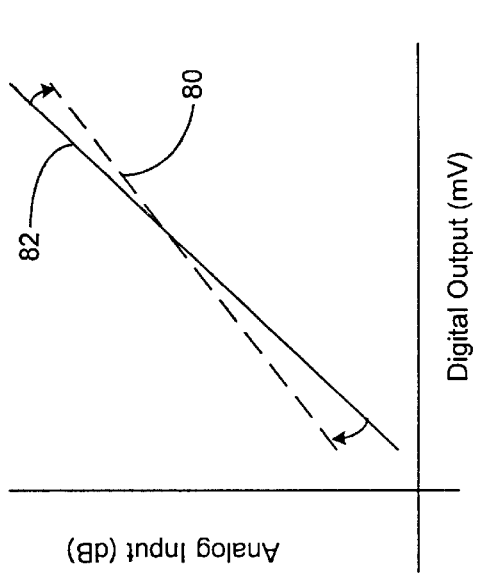
FIG. 4 is a plot of a predetermined transfer characteristic in accordance with the present invention.

FIG. 4 demonstrates the purpose and operation of the predetermined transfer characteristic. By way of example, it can be seen that a 40 millivolt change in output voltage corresponds to a 1 dB change in input power. It is common for the associated tolerance to be approximately +/−1.5 millivolts per dB. It will be appreciated that the transfer characteristic demonstrated in FIG. 4 is only a small portion of the entire transfer characteristic curve 80 which typically covers a range in excess of 60 dB.

Figure 2:
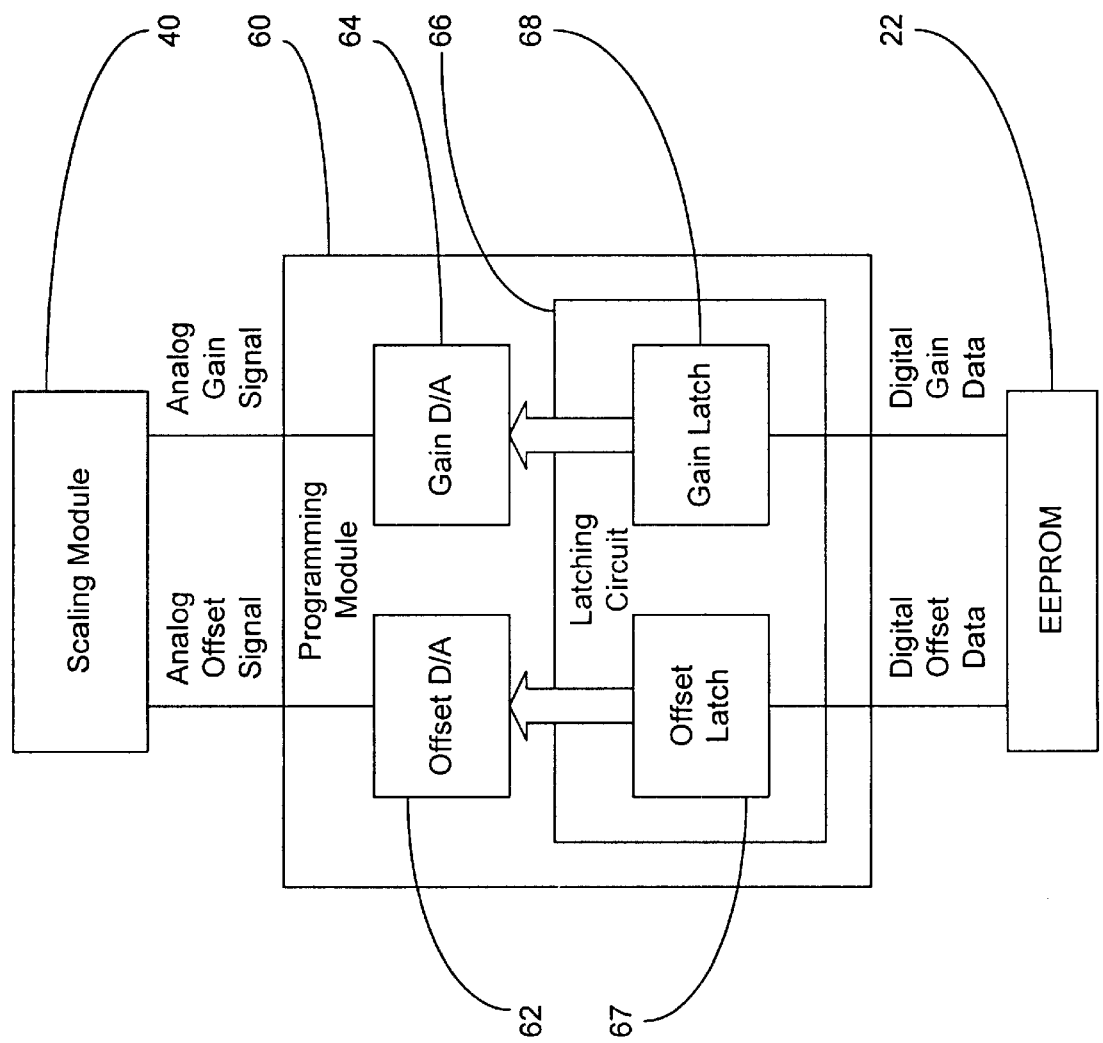
FIG. 2 is block diagram of a programming module according to the present invention.

Turning now to FIG. 2, it will be appreciated that the scaling module 40 requires offset and gain programming input. Therefore, the programming module 60 includes an offset D/A converter 62 for generating an analog offset signal based on digital offset data, and a gain D/A converter 64 for generating an analog gain signal based on digital gain data. Thus, the plurality of analog programming signals includes the analog offset signal and the analog gain signal. The analog gain signal provides a mechanism for setting the full scale reference voltage of the divider network integral to the A/D converter. This effectively changes the "gain" of the converter. It is preferred that the programming module 60 further includes a latching circuit 66 for storing the digital offset data to the offset D/A converter 62, and storing the digital gain data to the gain D/A converter 64. In one embodiment, the latching circuit 66 includes an offset latch 67 for storing the digital offset data to the offset D/A converter 62, and a gain latch 68 for storing the digital gain data to the gain D/A converter 64. While the illustrated embodiment shows distinct latches, it will be appreciated that only one level of latching is required to store the digital data from the EEPROM 22 or other programming source. It is important to note that while an EEPROM 22 is shown in FIG. 2, any programmable memory device or other digital data source will suffice. Furthermore, latching can occur at power-up of the video interface 20 or continuously where dynamic operation is desired.

It is important to note that the relative inexpensiveness of modern day D/A converters allows the voltage divider networks of conventional video interfaces to be replaced without substantially increasing the overall cost of the system. For example, an acceptable 12 bit D/A converter can be purchased for approximately two dollars. In fact, any additional cost associated with the D/A converters 62, 64 is more than offset by the elimination of the need to provide a select-in-test manufacturing process. Thus, the recent availability of inexpensive, high performance A/D and D/A converters allows the function of a conventionally analog circuit to be digitally programmed. Furthermore, adjustment of the scaling module to meet the predetermined transfer characteristic can be automated and performed dynamically under the present invention.

Figure 3:
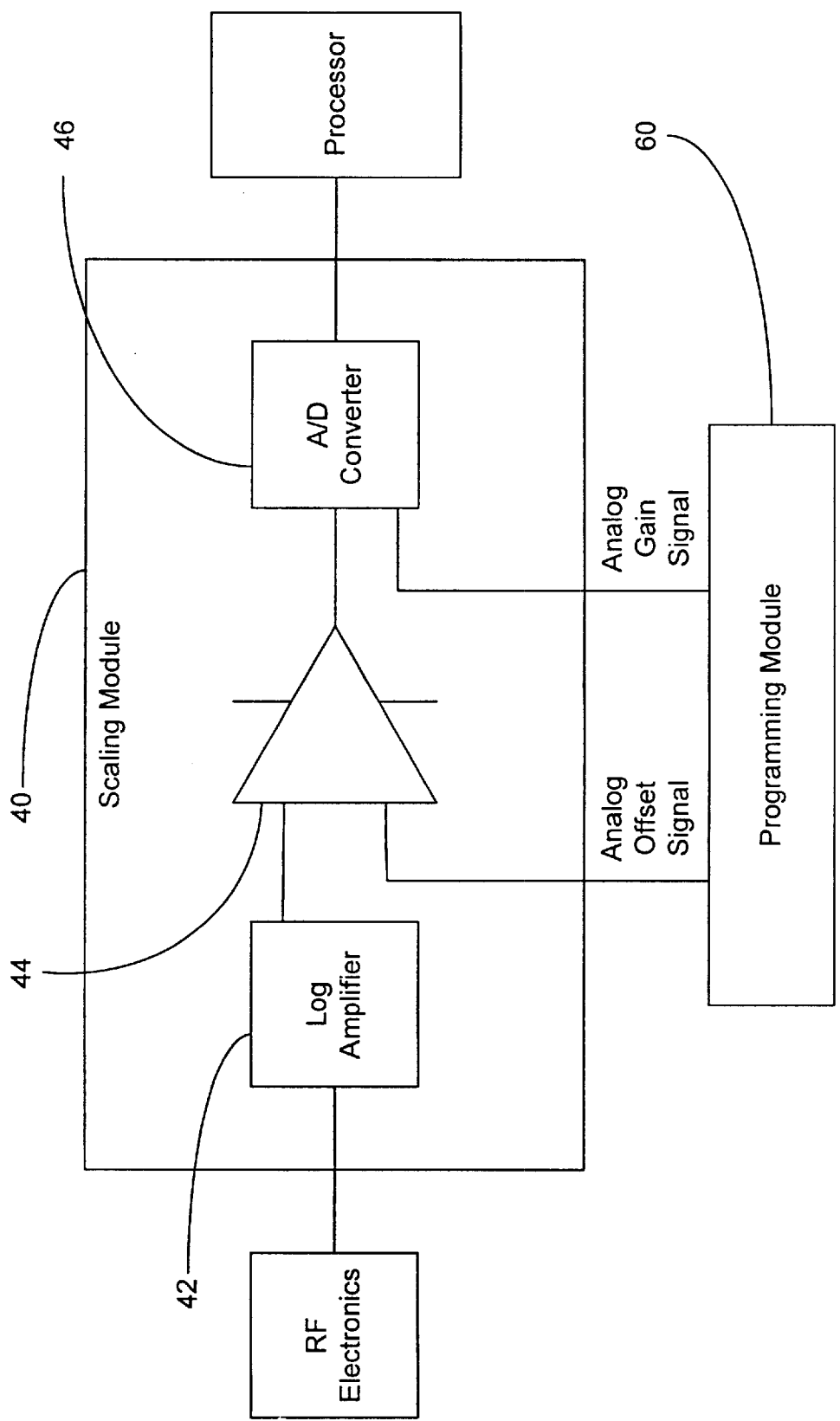
FIG. 3 is a block diagram of a scaling module according to the present invention.

FIG. 3 shows one embodiment of the scaling module 40. It can be seen that the scaling module 40 includes a log amplifier 42, a differential amplifier 44 and a A/D converter 46. The log amplifier 42 converts the analog input signal into a log output based on a logarithmic scale. The differential amplifier 44 compares the log output to the analog offset signal, and level shifts its output level based on the comparison (or offset). The A/D converter 46 converts the level shifted signal into the digital output signal based on the analog gain signal. Thus, based on the plurality of analog programming signals provided by the programming module 60, the differential amplifier 44 is able to maintain the appropriate offset and the A/D converter 46 is able to maintain the appropriate gain.

Figure 5:
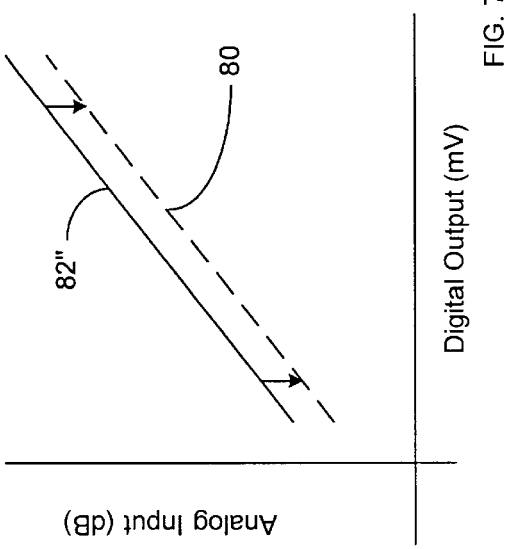
FIG. 5 is a plot demonstrating adjustment of the gain of a programmable video interface according to the present invention.
Figure 6:
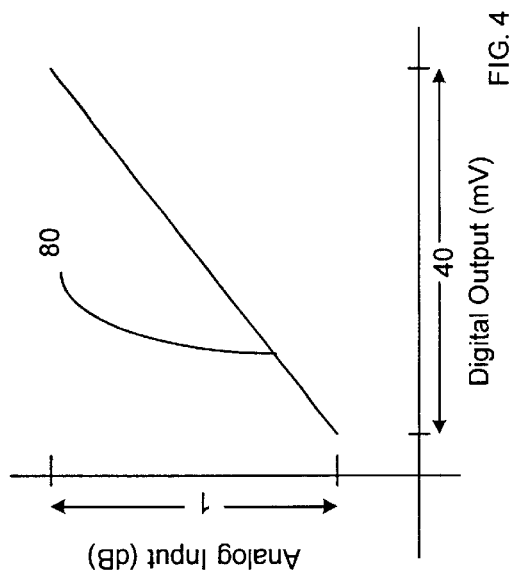
FIG. 6 is a plot of a typical log amplifier output according to the present invention.
Figure 7:
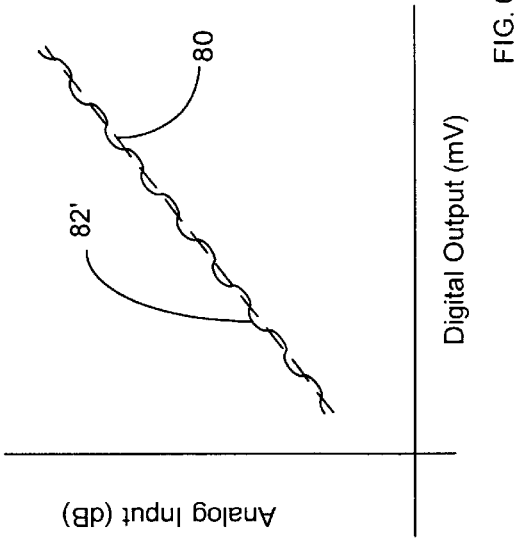
FIG. 7 is a plot demonstrating adjustment of the offset of a programmable video interface according to the present invention.

FIGS. 5–7 demonstrate the necessary adjustments that must be made in order to properly program the programming module. It is important to note that programming refers to determining the appropriate digital programming data that will produce the desired transfer characteristic within the associated tolerance. Specifically, FIG. 5 shows that determining the correct digital gain data establishes the slope of the actual transfer characteristic curve 82 as it relates to the predetermined transfer characteristic curve 80. FIG. 6 demonstrates that the actual transfer characteristic curve 82' may also have a ripple component as a result of the log amplifier 42. As will be discussed below, multiple measurements should be made in selecting the digital gain data to take into consideration this phenomenon. FIG. 7 demonstrates the purpose of determining the correct digital offset data. Thus, the actual transfer characteristic curve 82" must be shifted down in the illustrated example to match the predetermined transfer characteristic curve 80.

In light of the above, FIG. 8 demonstrates a method 100 for programming a video interface programming module. The method 100 includes the step 110 of determining digital gain data for the programming module. The digital gain data corresponds to the predetermined transfer characteristic, and the programming module transmits an analog gain signal to the scaling module based on the digital gain data. At step 130, digital offset data is determined for the programming module, where the digital offset data also corresponds to the predetermined transfer characteristic. The programming module transmits an analog offset signal to the scaling module based on the digital offset data. The digital offset data and the digital gain data can then be stored to a programmable memory device at step 102. In one embodiment, the method 100 further includes the step 150 of testing the scaling module for missing states or defective outputs, and the step 104 of latching the digital offset data and the digital gain data from the programmable memory device to the programming module. The significance of step 150 is that it allows the periodic monitoring of the health of the circuit after the system is deployed.

Turning now to FIG. 9, one embodiment of the step 110 of determining digital gain data is shown in greater detail. Specifically, it is preferred that the digital gain data is set to produce a full-scale output from the A/D converter at step 112. At step 114, the digital offset data is set to produce a mid-scale output from the differential amplifier. A known analog input signal is then injected into the log amplifier at step 116. It is preferred that the known analog input signal is injected at a first predetermined level and a second predetermined level (such as −5 dBm and −45 dBm), where the first predetermined level and the second predetermined level define a predetermined delta (such as 40 dB). Dividing the predetermined delta by the difference in the digital output signal at step 118 therefore provides the actual transfer characteristic. It will be appreciated that adjusting the digital gain data at step 120 adjusts the slope of the actual transfer characteristic curve 82 (FIG. 5). As already discussed, it can be seen that the actual transfer characteristic curve 82' has a ripple effect as shown in FIG. 6. Thus, decisional step 122 provides injection of additional known inputs to allow for averaging. Specifically, varying the starting values in two dB increments (such as −7, −9, −11 and −13 dBm), while maintaining the 40 dB delta should span the log ripple. The 40 dB delta divided by the average count different therefore gives the average dB per step. The gain D/A converter can therefore be adjusted to give the required dB per step.

As shown in FIG. 10, a preferred approach to determining the correct digital offset data at step 130 includes the step 132 of injecting a known analog input signal into the scaling module. Adjusting the digital offset data at step 134 such that the digital output signal equals a predetermined digital output value allows the actual transfer characteristic curve 82' (FIG. 7) to be "shifted" to match the predetermined transfer characteristic curve 80. Once again, the ripple effect can be taken into account at step 136 by injecting additional known analog input signals into the scaling module. This approach allows the best fit value to be determined.

Figure 11:
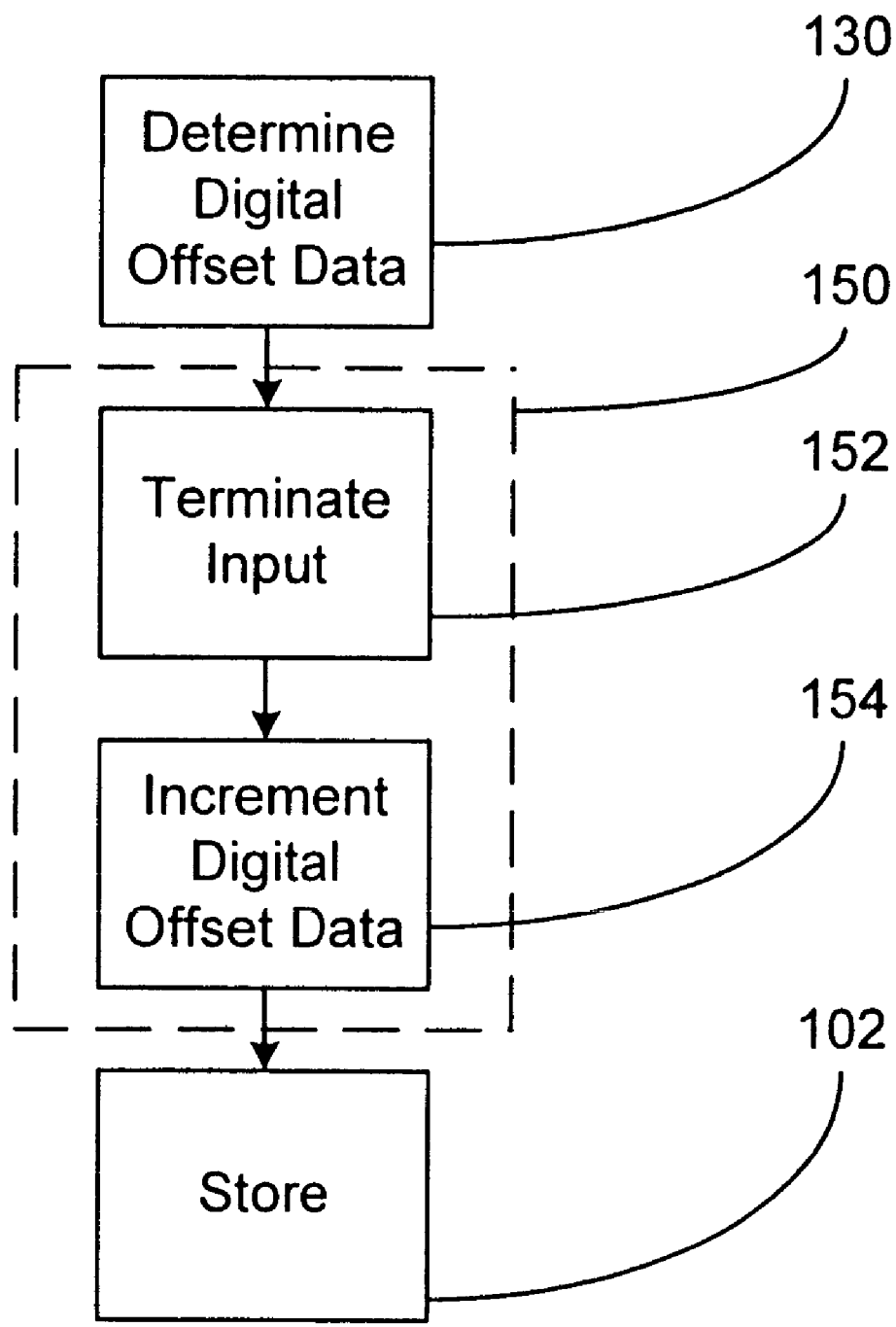
FIG. 11 is a flowchart of a process for testing a scaling module for missing states or defective outputs according to the present invention.

Turning now to FIG. 11, one embodiment of the testing step 150 is shown in greater detail. It can be seen that at step 152, the input of the scaling module is terminated. The digital offset data is then incremented at step 154 to insure that there are no stuck bits or missing codes.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A programmable video interface comprising:
   a scaling module for converting an analog input signal into a digital output signal based on a plurality of analog programming signals; and
   a programming module for generating the plurality of analog programming signals, the analog programming signals maintaining operation of the scaling module at a predetermined transfer characteristic and an associated tolerance;
   said programming module generating the plurality of analog programming signals based on digital programming data;
   wherein the programming module includes
      an offset digital to analog converter for generating an analog offset signal based on digital offset data; and
      a gain digital to analog converter for generating an analog gain signal based on digital gain data;
      and wherein said plurality of analog programming signals includes the analog offset signal and the analog gain signal.

2. The interface of claim 1 wherein the programming module further includes a latching circuit for storing the digital offset data to the offset digital to analog converter, the latching circuit further storing the digital gain data to the gain digital to analog converter.

3. The interface of claim 2 wherein the latching circuit includes an offset latch for storing the digital offset data to the offset digital or analog converter.

4. The interface of claim 2 wherein the latching circuit includes a gain latch for storing the digital gain data to the gain digital to analog converter.

5. A programmable video interface comprising:
   a scaling module for converting an analog input signal into a digital output signal based on a plurality of analog programming signals; and
   a programming module for generating the plurality of analog programming signals, the analog programming signals maintaining operation of the scaling module at a predetermined transfer characteristic and an associated tolerance;
   said programming module generating the plurality of analog programming signals based on digital programming data;
   wherein the programming module includes:
      an offset digital to analog converter for generating an analog offset signal based on digital offset data;
      a gain digital to analog converter for generating an analog gain signal based on digital gain data; and
      said plurality of analog programming signals including the analog offset signal and the analog gain signal;
   wherein the scaling module includes
      a log amplifier for converting the analog input signal into a log output based on a logarithmic scale;
      a differential amplifier for comparing the log output to one of the analog programming signals, the differential amplifier level shifting its output based on the comparison; and
      an analog to digital converter for converting the level shifted signal into the digital output signal based on one of the analog programming signals, the conversion signal mapping a nominal output signal range of the log amplifier to an input range of the analog to digital converter.

6. The interface of claim 5 wherein the differential amplifier compares the log output to an analog offset signal.

7. The interface of claim 5 wherein the analog to digital converter scales the conversion signal based on the analog gain signal.

8. A programming module for generating a plurality of analog programming signals, the programming module comprising:
   an offset digital to analog converter for generating an analog offset signal based on digital offset data; and
   a gain digital to analog converter for generating an analog gain signal based on digital gain data;
   said plurality of analog programming signals including the analog offset signal and the analog gain signal, the analog offset signal and the analog gain signal maintaining operation of a programmable video interface scaling module at a predetermined transfer characteristic and an associated tolerance.

9. The programming module of claim 8 further including a latching circuit for storing the digital offset data to the offset digital to analog converter, the latching circuit further storing the digital gain data to the gain digital to analog converter.

10. The programming module of claim 9 wherein the latching circuit includes an offset latch for storing the digital offset data to the offset digital to analog converter.

11. The programming module of claim 9 wherein the latching circuit includes a gain latch for storing the digital gain data to the gain digital to analog converter.

12. A method for programming a video interface programming module, the method comprising the steps of:

determining digital offset data for the programming module, the digital offset data corresponding to a predetermined transfer characteristic for the video interface, the programming module transmitting an analog offset signal to a scaling module based on the digital offset data;

determining digital gain data for the programming module, the digital gain data corresponding to the predetermined transfer characteristic, the programming module transmitting an analog gain signal to the scaling module based on the digital gain data, the scaling module converting an analog input signal into a digital output signal based on the predetermined transfer characteristic; and storing the digital offset data and the digital gain data to a programmable memory device;

wherein the step of converting the analog input signal into the digital output signal includes the steps of converting the analog input signal into a log output with a log amplifier based on a logarithmic scale, generating a conversion signal with a differential amplifier based on the log output and the analog offset signal, and converting the conversion signal into the digital output signal with an analog to digital converter, the method further including the steps of (a) setting the digital gain data to produce a full-scale output from the analog to digital converter;

(b) setting the digital offset data to produce a mid-scale output from the differential amplifier;

(c) injecting a known analog input signal into the log amplifier at a first predetermined level and a second predetermined level, the first predetermined level and the second predetermined level defining a predetermined delta;

(d) dividing the predetermined delta by a difference in the digital output signal; and (e) adjusting the digital gain data such that the predetermined delta and the difference in the digital output signal approximate the predetermined transfer characteristic.

13. The method of claim 12 further including the steps of:

repeating the step of injecting a known analog signal for a plurality of starting values; and dividing the predetermined delta by an average difference in the digital output signal.

14. A method for programming a video interface programming module, the method comprising the steps of:

determining digital offset data for the programming module, the digital offset data corresponding to a predetermined transfer characteristic for the video interface, the programming module transmitting an analog offset signal to a scaling module based on the digital offset data;

determining digital gain data for the programming module, the digital gain data corresponding to the predetermined transfer characteristic, the programming module transmitting an analog gain signal to the scaling module based on the digital gain data, the scaling module converting an analog input signal into a digital output signal based on the predetermined transfer characteristic;

storing the digital offset data and the digital gain data to a programmable memory device;

further including the steps of:

injecting a known analog input signal input into the scaling module; and adjusting the digital offset data such that the digital output signal equals a predetermined digital output value.

15. The method of claim 14 further including repeating the step of injecting a known analog signal for a plurality of known analog input signals.

16. A method for programming a video interface programming module, the method comprising the steps of:

determining digital offset data for the programming module, the digital offset data corresponding to a predetermined transfer characteristic for the video interface, the programming module transmitting an analog offset signal to a scaling module based on the digital offset data;

determining digital gain data for the programming module, the digital gain data corresponding to the predetermined transfer characteristic, the programming module transmitting an analog gain signal to the scaling module based on the digital gain data, the scaling module converting an analog input signal into a digital output signal based on the predetermined transfer characteristic;

storing the digital offset data and the digital gain data to a programmable memory device; and testing the scaling module for stuck bits.

17. The method of claim 16 further including the steps of:

terminating an input of the scaling module; and incrementing the digital offset data.

18. The method of claim 17 further including the step of latching the digital offset data and the digital gain data from the programmable memory device to the programming module.

* * * * *